US005542987A

United States Patent [19]
Gatt et al.

[11] Patent Number: 5,542,987
[45] Date of Patent: *Aug. 6, 1996

[54] METHOD FOR CLEANING THE SURFACES OF A MOTOR VEHICLE

[75] Inventors: Shimon Gatt; Yechezkel Barenholz; Herve Bercovier, all of Jerusalem; Zvi Eldar, Haifa, all of Israel

[73] Assignee: Yissum Research Development Company of the Hebrew University of Jerusalem, Jerusalem, Israel

[*] Notice: The term of this patent shall not extend beyond the expiration date of Pat. No. 5,376,183.

[21] Appl. No.: 364,586

[22] Filed: Dec. 27, 1994

Related U.S. Application Data

[63] Continuation-in-part of Ser. No. 13,846, Feb. 5, 1993, Pat. No. 5,376,183, which is a continuation-in-part of Ser. No. 653,319, Feb. 11, 1991, Pat. No. 5,401,413.

[51] Int. Cl.$^6$ ........................................................ B08B 7/00
[52] U.S. Cl. .................................................. 134/39; 134/40
[58] Field of Search ................................. 134/25.1, 25.5, 134/38–40, 42

[56] References Cited

U.S. PATENT DOCUMENTS

| | | | |
|---|---|---|---|
| 4,087,356 | 5/1978 | Marconi et al. | 210/422 |
| 4,146,470 | 3/1979 | Mohan et al. | 210/422 |
| 4,230,562 | 10/1980 | Olivieri et al. | 210/610 |
| 4,284,509 | 8/1981 | Lindorfer et al. | 210/922 |
| 4,382,873 | 5/1983 | Gatellier et al. | 210/610 |
| 4,414,333 | 11/1983 | Olivieri et al. | 210/610 |
| 4,462,910 | 7/1984 | Lepain et al. | 210/610 |
| 4,623,468 | 11/1986 | Lepain et al. | 210/922 |
| 4,811,791 | 3/1989 | Harnoy et al. | 166/305.1 |
| 4,822,490 | 4/1989 | Dyadechko et al. | 210/922 |
| 5,019,174 | 5/1991 | Wallach | 134/40 |

FOREIGN PATENT DOCUMENTS 2172796  5/1973  France.

OTHER PUBLICATIONS

"Lecithins", Bernard F. Sauhuaj et al, American Oil Chemists' Society, 1985.

"Korrosionsschutz Durch Beschichtungsstoffe", Hanser Verlag, Oberflachenvorbereitung, 1980, pp. 246–248.

"Microbial Growth and Survival in Extremes of Environment", G. W. Gould et al., Academic Press, 1980.

"Bacterial Adherence", E. H. Beachey, Chapman and Hall, 1980.

"Bacterial Adhesion, Mechanisms and Physiological Significance", by Dwayne C. Savagae et al., Plenum Press, 1985.

"Bacterial Adhesins", K. Jann et al., Springer–Verlag, 1990.

"Liposomes: Preparation Characterization and Preservation", D. Lichtenberg et al, Methods of Biochemical Analysis, vol. 33, pp. 337–462, Wiley, 1988.

"Petroleum Microbiology", Ronald M. Atlas, MacMillan, 1984.

"Enhanced Biodegradation of Pesticides in the Environment", Kenneth D. Racke et al., American Chemical Society, 1990.

"Preparation of Liposomes", Roger R. C. New, Liposomes: A Practical Approach, IRL Press, Oxford, 1990.

"Stability and Phase Behavior of Mixed Surfactant Vesicles", S. A. Safran et al, The American Physical Society, 1991.

"Evidence from Liposome Encapsulation for Transport-Limited Microbial Metabolism of Solid Alkanes", Applied and Environmental Microbiology, vol. 55, No. 2, Feb., 1989, Miller et al., pp. 269–274.

"Liposomal Solution for Microbial Catalysis in Organic Solvents?", Trends in Biotechnology, vol. 6, No. 1, Jan. 1988, pp. 1–2.

"In Situ Biorestoration of Organic Contaminants in the Subsurface", Environmental Science and Technology, vol. 23, No. 7, Jul. 1989, pp. 760–766.

Primary Examiner—Thomas G. Wyse
Attorney, Agent, or Firm—Lowe, Price, LeBlanc & Becker

[57] ABSTRACT

The invention provides a method for cleaning the surfaces of a motor vehicle which is contaminated with wastes containing organic or lipophilic deposits, comprising applying liposomes thereto, which liposomes modify the physical properties of the wastes to increase the polarity and wettability thereof.

8 Claims, No Drawings

METHOD FOR CLEANING THE SURFACES OF A MOTOR VEHICLE

The present specification is a continuation-in-part of U.S. Ser. No. 08/013,846, filed on Feb. 5, 1993, entitled, "Method for Cleaning Industrial and Domestic Articles and Surfaces Contaminated with Organic or Lipophilic Wastes, " now U.S. Pat. No. 5,376,183, which in turn is a continuation-in-part of U.S. Ser. No. 07/653,319, filed Feb. 11, 1991, and entitled "Method and Composition for Enhancing the Biodegradation of Biodegradable Organic Wastes, " now U.S. Pat. No. 5,401,413.

The present invention relates to a method for cleaning articles and surfaces contaminated with organic or lipophilic wastes. More particularly, the present invention relates to a method for cleaning the surfaces of a motor vehicle by applying liposomes thereto.

Prior research and patents have been directed to enhanced oil recovery using modified liposomes.

Thus, e.g., in U.S. Pat. No. 4,811,791 there is described and claimed a method of recovering a petroleum from an underground source thereof, comprising injecting into said underground source a petroleum displacement agent comprising a fluid and a modified liposome, said liposome being present in an amount sufficient to lower the interfacial tension between said fluid and said petroleum to below about 50 millidynes. Said patent, however, was limited to the recovery of petroleum from an underground source.

As is known, there are many industrial sites such as petroleum tank farms, chemical plants and elsewhere, where crude or refined hydrocarbons, or hydrocarbon wastes such as oil, gasoline, or the like, are spilled on the ground or into bodies of water such as ponds, lakes and oceans. Such wastes not only spread out and soak through the surface of the ground, but seep into the ground and often float on the water table or disperse in ground water.

Presently, cleanup involves procedures such as excavation of the soil and incineration of the soil, followed by disposal at a suitable disposal site. This is not only costly, but decontamination is often not complete and the disposal site itself then becomes a hazardous site.

An alternative to this costly disposal method is "washing" of the contaminated soil. This involves drilling one or more interceptor wells around the contaminated site to intercept the plume of hazardous material. It is preferred to flush or wash the contaminated soil with water, preferably water containing one or more surfactants, by spraying the site and allowing the water to percolate down through the soil and assist in "washing" the soil and driving the waste to the interceptor well or wells. This technique has been, and is, used around refineries to recover crude and refined hydrocarbons; on larger sites, the solvent system (water or water and surfactant) can be stripped of the hazardous waste and recycled for spraying to minimize costs. Presently, the cost of "soil washing" is very high, because of the cost of the surfactants and the fact that it may take years of spraying and recycling of solvent to wash the hazardous waste from the site and lower the amount of waste to an acceptable level.

The surfactants used in the above method might present an ecological hazard and they are not entirely effective, which increases the time required to wash the soil.

In contradistinction to the previously suggested methods and agents, U.S. patent application Ser. No. 07/653,319, the teachings of which are incorporated herein by reference, provides a method for readily cleaning up sites contaminated with hydrocarbons which can be carried out efficiently without effecting the ecology and at relatively low costs.

According to the invention, it was found, as described hereinafter, that liposomes modify the physical properties of oil and other organic and lipophilic wastes by increasing the polarity and wettability thereof.

Thus, in addition to petroleum, among the wastes which could be treated according to the present invention are:
1. Aromatic hydrocarbons (e.g. toluene, xylene and phenanthrene)
2. Nitro aromatics
3. Creosote
4. Chlorinated aliphatics (e.g. tri-or or tetrachloroethylene
5. Chlorinated aromatics (e.g. hexachlorobenzene, pentachlorophenol)
6. Polychlorinated biphenyl (PCB)
7. Pesticides (PHA's, TNT, RDS)
8. Xenobiotics
9. Greases
10. Synthetic or natural lipids (fats)

Phospholipids, which are the raw materials from which the liposomes used in the present invention are prepared, are naturally occurring membrane-lipids in which glycerol is linked to two long chain fatty acids, a phosphoric acid residue and a nitrogen-containing base (e.g. choline). While most phospholipids of animal origin have saturated and one unsaturated fatty acid, plants (e.g. soybean) supply phospholipids having mostly two polyunsaturated fatty acids. For large scale application of liposomal phospholipids for environmental aspects, availability and a low cost are two major prerequisites. Plant phospholipids fulfill both requirements: their potential yield is more than half-a-million tons per year and, as by-products of the edible oil industry; they are being used for animal feed.

Liposomes for use in the methods of the present invention can be prepared from phospholipids, which may be supplied in a dry state or in a solution of phospholipid in an organic solvent which is either immiscible with water (e.g., ether, alkylhalides etc.) or miscible with water (e.g., alcohols, dimethylsulfoxide etc).

Numerous methodologies have been developed for preparation of liposomes; they can be prepared in various sizes and number of lamellae. For use in the method of the present invention, unilamellar liposomes are preferred.

The preparation of small unilamellar liposomal vesicles on a small scale can be achieved by ultrasonic irradiation or extrusion of hydrated phospholipids. For large scale preparation, phospholipids are hydrated by mechanical shaking of dry phospholipids in water or water-containing salts. The multilamellar liposomes thus formed are then homogenized in dairy homogenizers, which provide a high shearing force. Using this approach, small, unilamellar vesicles of natural or modified soybean phosphatides of 20–80 nm in diameter were produced, which were stable to storage at room temperature in water and resisted aggregation or fusion for at least two years.

As stated above, it has now been found that these unilamellar liposomes modify the physical properties of organic and lipophilic wastes wot increase the polarity and wettability thereof.

In a further aspect of the present invention, as described and claimed in U.S. Ser. No. 08/013,846, the teachings of which are also incorporated herein by reference, it was found that liposomes can be used for cleaning industrial and domestic surfaces and articles contaminated with organic or lipophilic wastes.

In a still further aspect of the present invention, it has now ben found that liposomes can be used for cleaning surfaces of motor vehicles, and that unexpectedly superior results are obtained when such liposomes are used instead of the common detergents presently in use today for such purposes.

Thus, according to the present invention there is now provided a method for cleaning the surfaces of a motor vehicle which is contaminated with wastes containing organic or lipophilic deposits, comprising applying liposomes thereto, which liposomes modify the physical properties of said wastes to increase the polarity and wettability thereof. p In preferred embodiments of the present invention, said surfaces are coated metal, painted metal, plastic and glass surfaces, commonly found on motor vehicles.

As will be described in the examples hereinafter, the method of the present invention is effective for cleaning the grease and grime deposits from the surfaces of a motor vehicle, wherein said deposits include oils, greases, gasoline residues, and carbonacious combustion products.

In contradistinction to the detergents presently used today in commercial car-washing establishments, which leave an undesirable, cloudy film that then has to be removed on the vehicle surfaces, the method of the present invention leaves a desirable, protective, thin layer providing a wax-like, shiny effect on the metal, plastic and chrome surfaces of said vehicle. Furthermore, said protective layers, which is also deposited on the glass surfaces of said vehicle, has been found to possess a water-repellant effect, as exemplified hereinafter.

As discussed herein, the preferred liposomes of the present invention have vesicles of a diameter of about 20–80 nm, and are preferably phospholipid liposomes.

In U.S. Pat. Nos. 4,230,562 and 4,414,333 there are described methods and compositions for depolluting fresh water and salt water bodies from crude oil, petroleum products and their derivatives, which include, inter alia, providing lecithin as a phosphorus source. However, as indicated hereinbefore, for rapid and efficient conversion of a phospholipid source such as lecithin into the structural form of small unilamellar liposomes having the desired properties of modifying polarity and wettability of organic wastes for use in the methods of the present invention it is necessary to subject the same to ultrasonic irridation, extrusion or similar processes. Therefore, neither of these patents teaches or suggests the methods of the present invention.

In U.S. Pat. No. 5,019,174 there is described a lipid vesicle skin cleaner and a method for removing oil from a surface using the same through liposomal encapsulation. As will be noted, however, said patent is directed to, and limited to, the use of paucilamellar lipid vesicles which are broken or fractured and reformed, thereby encapsulating the oil present on said surface.

In contradistinction to the teachings of said patent, the present invention utilizes liposomes which modify the physical properties of organic and lipophilic deposits to increase the polarity and wettability thereof, thereby facilitating their removal from surfaces on which they are found. Thus, in the present invention, small vesicles, i.e., those having a diameter of about 20–80 nm, were found to be especially effective; this is the opposite from what would be expected from the teaching of said patent, since the encapsulated volume is inversely proportional to the liposomal size. Furthermore, as can be sen from the examples herein, oil deposits treated with the unilamellar vesicles of the present invention were found to be located in the aqueous medium after centrifugation, proving that this oil was not encapsulated and instead was removed by an entirely different mechanism, which is neither taught nor suggested by said patent.

While the invention will now be described in connection with certain preferred embodiments in the following examples so that aspects thereof may be more fully understood and appreciated, it is not intended to limit the invention to these particular embodiments. On the contrary, it is intended to cover all alternatives, modifications and equivalents as may be included within the scope of the invention as defined by the appended claims. Thus, the following examples which include preferred embodiments will serve to illustrate the practice of this invention, it being understood that the particulars shown are by way of example and for purposes of illustrative discussion of preferred embodiments of the present invention only and are presented in the cause of providing what is believed to be the most useful and readily understood description of formulation procedures as well as of the principles and conceptual aspects of the invention.

EXAMPLE 1

1 Gram of sandy soil contaminated with polycarbonated biphenyl (PCB) was dispersed in water, and liposomes prepared form soybean lecithin were added at varying concentrations. The mixtures, in 5 ml volume, were subjected to ultrasonic irradiation in a horn-cup (Branson sonifier 250 W) for 13 minutes at 75–80% output and an initial temperature of 45°–50° C. The samples were then separated by centrifugation to an aqueous supernatant and sedimented soil. Gas-liquid chromatographic (GLC) analysis indicated that when the final concentration of the liposomal lecithin was 0.15%, 37% of the PCB was removed from sand and when it was raised to 0.5%, 67% of the PCB was removed from the sand and located in the aqueous medium.

EXAMPLE 2

The experiment as in Example 1 was repeated, except that the PCB was present in a sludge, containing 60% moisture and 5% hydraulic fluid. 1 ml of the sludge was mixed with water and liposomes to a final volume of 5 ml and subjected to ultrasonic irradiation as per Example 10. Following centrifugation, the aqueous phase contained 33% of the total PCB.

EXAMPLE 3

5 g soil contaminated with PCB was introduced into a glass column and a dispersion containing 0.5% liposomes (by lecithin weight) was filtered through. Analysis indicated that 40% of the PCB were eluted from the soil.

EXAMPLE 4

A metal bar coated with silicone grease was subjected to ultrasonic irradiation, in a sonic bath (Transsonic 460/H, Elma, Bergweis, Austria) containing 0.1% soybean lecithin liposomes for 10 minutes at 70° C. This resulted in complete removal of the silicone grease from the metal.

EXAMPLE 5

Metal bars coated with heavy organic grease were sonicated with 0.1% liposomes for 15 minutes, at 70° C. They were then rinsed with water, dried with a fan and coated, by spraying, with a transparent film of lacquer ("Superspeed," Saria Inc., San Carlos, Calif.). The nature of the lacquer-coating and its tight adherence to the metal indicated a total degreasing of the metal.

The above procedure was compared using liposomes of soybean and egg lecithin and using liposomes ranging from 100% soybean phosphatidylcholine (PC, lecithin) down to 10% PC. In all cases, a complete degreasing of the metal and stable lacquer-coating was obtained.

EXAMPLE 6

A brass tube, covered with a tightly-adhering, burned out graphite-containing organic ointment, was subjected to ultrasonication in a bath-sonicator as per Example 4. In this case, because of the extremely strong adherence of the burned-out ointment, 0.1–0.5% liposomes did not completely remove it. When the concentration of the latter was raised to 3%, there was a complete removal of the covering layer, resulting in a corresponding shining area on the brass.

EXAMPLE 7

Dirty dishes (e.g., earthenware, ceramic, plastic and china plates, glasses and stainless steel utensils), covered with dried-out food residues, were introduced into an AEG (Favorit-L) dishwasher and subjected to a standard cycle (double rinse with cold water; wash with heating to 60° C.; rinse with cold water; rinse at 60° C.; drying), but instead of dishwasher soap, about 10–20 ml of 10% liposomes prepared from soybean lecithin were introduced into the soap-storage compartment of the machine. Following the entire cycle, the dishes were treated and the following was observed: All glass dishes in the upper portion of the dishwasher were perfectly clean, as were most of the plates and utensils. The exceptions were some spots of tightly-adhering dirt particles on those plates and utensils which were very tightly packed in the dishwasher, so that the spray probably could not reach them directly.

The same procedure was repeated using a Telsa International mini (Sweden) dishwasher at 65° C., followed by three washes with cold water and one at 55° C. Using 15 ml of 17% liposomes, all glass, ceramic, china and stainless steel dishes and utensils were completely cleaned.

EXAMPLE 8

0.5% liposomes, prepared from soybean-lecithin in tap water, were applied to a cloth and the latter was used to wet a thick layer (about 2 mm) of soot covering the interior (burner and burning chamber) of a Delville kerosene heater. Five minutes after this application, the soot was wiped with a sloth slightly wetted with water, resulting in complete removal of the soot and leaving the metal entirely clean. In a parallel experiment in which the soot was treated with a cloth wetted with water (instead of the liposomes), wiping with a wet cloth removed only a small portion of the soot, most of which remain adhered to the metal of the burner and chamber.

EXAMPLE 9

Soot from the above-mentioned burner which fell on the floor (made of ceramic tiles) was wetted with 0.5% liposomes and then wiped with a dry paper tissue, resulting in complete removal of the soot and cleanup of the floor. In parallel, wetting the soot with water only and wiping with a paper tissue removed only a small portion of the soot from the floor.

EXAMPLE 10

Cleaning a plastic board contaminated with grease: The grease could not be removed by wiping. Half of the contaminated plastic board was placed in Transsonic 460/H, 35 KHz from Elma Bergweis, Austria. The ultrasonic bath contained 1200 ml of 0.1% (by weight of lecithin) liposomes in water. After 10 minutes of ultrasonic irradiation at 65° C., the plastic board was removed and washed. The complete cleaning of that part of the plastic board which was embedded in the liposomes was achieved.

EXAMPLE 11

Samples of various metal pieces (e.g., brass, nickel, aluminum, iron) covered with grease were placed in an ultrasonic bath (Transsonic 460/H, 35 KHz) containing 1.2 liters of small unilamellar liposomes, 0.1% lecithin (by weight) in water. After 10 minutes of ultrasonic irradiation at 60°–70° C., the metal pieces were removed from the bath and washed in water. All metal pieces were cleaned of the grease. The grease floated over the liposomes dispersion and metal dust precipitated in the bottom. The grease which was collected from the surface could now be potentially subjected to bioremediation.

EXAMPLE 12

Samples of various metals contaminated with grease were tested for contact angle. For this, a drop of water was placed over the contaminated metal pieces. The contact angle was measured using a Zeiss microscope and found to be about 180°. These metal pieces were placed in a beaker containing 200 ml of 0.1% small unilamellar liposomes (SUV) prepared from soybean lecithin (by weight of lecithin in tap water). The beaker was placed in an ultrasonic bath (SONOREX Super RK 103H, 35 KHz, 160–320 W) containing tap water. After 10 minutes of ultrasonic irradiation, starting from 45° C. and ending at 55.5° C., the metal pieces were removed and washed in hot water. The metal pieces were tested by measuring the contact angle as described above. The test results showed that after cleaning, the contact angle was reduced to values below 90°. This indicates defatting of the metal. Comparison with treatment with conventional organic solvents show contact angles higher or similar to those obtained with the liposomes. These measurements followed the procedure of K. A. van Oeteren, as described in *Korrosionsschutz durch Beschichtungsstoffe*, Hanser Verlag, Munchen, Wien, pp. 246–248 (1980).

EXAMPLE 13

Example 12 was repeated, but the metal pieces were placed in water (and not in lecithin liposomes). There was no removal of the grease.

EXAMPLE 14

The same 200 ml of liposomes that were used in Example 12 were again used for treating other grease-coated metal pieces. Two minutes of ultrasonic irradiation at 69° C. was sufficient to obtain complete degreasing of the metal pieces, indicating that the liposomes, recovered after degreasing, could be re-used for cleanup of other grease-covered metals.

EXAMPLE 15

In a test to see if machine oil interferes with degreasing, 16 ml of machine oil was added to the same liposomes (200 ml) used in the previous example and metal pieces contaminated with grease were added. Five minutes of ultrasonic irradiation at 76° C. caused oil emulsification and partial degreasing. The metal pieces were then transferred to 200 ml of 0.1% fresh liposomes; complete degreasing was obtained after 10 minutes of ultrasonic irradiation at 60° C.

EXAMPLE 16

The experiment descried in Example 12 was repeated, the metal pieces were cleaned and the grease-dispersion in the liposomes was transferred to four glass tubes, which were centrifuged at 10,000 rpm for 10 minutes; all the oil floated above the liposome dispersion. Metal dust precipitated on the bottom of the test-tubes and the liposomes could be reused for degreasing. The grease from the top had special properties of adsorption to paper, ceramics, etc. and, it is expected, also to bacteria, thereby facilitating its biodegradation.

EXAMPLE 17

Metal pieces coated with solid kidney fat were placed in an ultrasonication bath with liposomes, as described in Example 12. After 7 minutes of irridation at 64° C., a contact angle test gave an angle smaller than 90°. The metal pieces were then transferred to 1% dispersion of soybean-lecithin small unilamellar liposomes (SUV); better defatting (but still not complete) was obtained after 10 minutes of ultrasonic irradiation at 72° C. When liposomes prepared from 1% egg yolk lecithin were used, complete defatting was obtained.

EXAMPLE 18

The procedure of Example 17 was repeated; however, the metal pieces coated with kidney fat were defatted by one-step ultrasonic irradiation in 1% small unilamellar liposomes of egg lecithin. Complete defatting (based on contact angle measurement) was obtained.

EXAMPLE 19

Degreasing by 0.08% liposomes (by weight of lecithin) in pure water was carried out, using an industrial degreasing machine produced by Zippel, Neutraubling, Germany. The machine, like a dishwasher, has two sprinkers—one on the bottom and one at the top—which rotate an sprinkle at a pressure of 4 bars at 70° C. The machine has two reservoirs, each having a volume of 300 liters. Into the left reservoir, the liposomes (0.1%) at pH 6.8 were introduced, while the right reservoir was filled with tap water. The machine has monitors for temperature, pH and conductivity. The extent of degreasing was measured, using an Ahlbrandt system kit based on an interfacial pressure test.

EXAMPLE 20

Cleaning of a plastic tray, which was heavily contaminated with oil, grease and metal dust: The tray was placed in the above-mentioned Zippel machine with its face down. The cleaning cycle included 3 minutes of sprinkling with liposomes and 1 minute of sprinkling with the water, then drying. This process was sufficient for complete cleaning of the tray. Only one spot, which remained outside the coverage of the sprinklers, remained dirty.

EXAMPLE 21

During the degreasing process described above in Example 20, most of the oil or grease floated over the liposome reservoir and only a small amount over the tap water reservoir. The oil from both reservoirs was easily removed by paper or a metal-net, leaving clean reservoirs behind. The liposome-reservoir could be filtered to remove small particles, without loss of the liposomes, through filters of 0.2 µm pore size.

EXAMPLE 22

The Zippel degreasing machine was filled with various metal pieces of different sizes and shapes, including a large engine-block, knife blades, metal sheets, copper blocks, aluminum locks, iron and stainless steel pipes, screws, electronic contacts, and many other machined parts which were coated with various oils, greases and fats. The degreasing cycle described in Example 17 led to complete degreasing of the respective items, making them suitable for further processing such as phosphorization, painting, lacquer-coating, etc.

EXAMPLE 23

A variety of tubes and pipes was placed in a cleaning machine (Niagara Machinery AB, Gotebory, Sweden) which utilizes a fast stream of hot water sprayed at a pressure of 6 bars. One thousand liters of 0.09% soybean liposomes were introduced into this cleaning machine, and the pipes and tubes were sprayed for 12 seconds at 70° or 80° C., resulting in their degreasing.

EXAMPLE 24

The same machine as in Example 23 was used for cleaning aluminum tubes coated with an oil enriched with rapeseed glycerides and which also included 15% fatty acids (e.g., oleic acids). After 4 cycles of 10 seconds each, the tubes were completely deoiled.

EXAMPLE 25

The conditions of Example 22 were repeated, except that 5 liters of Henkel Sellcleaner 87 M (i.e., at a final concentration of 0.5%, which is 4–8 times less than when used alone for metal cleaning) were added to the liposomes. Spraying this mixture (i.e., 0.09% liposomes and 0.5% Henkel Sellcleaner 87 M) for 10 seconds at 80° C. resulted in degreasing, characterized by a complete wetting of the metal tubes and bars.

EXAMPLE 26

Liposomes were tested for their potential use in cleanup of electronic components, electrical parts and printed circuit boards. Several uncleaned electronic boards were immersed in soybean or egg liposomes (0.1–0.5%) and subjected to ultrasonications for 10–15 minutes at 60° C. in the Transsonic 460/H bath sonicator. This resulted in cleanup of the boards by removal of the brownish material covering the electronic circuit connections.

Procedure described in the above examples, when carried out without the presence of liposomes, resulted in no or only partial removal of the various contaminating wastes from the various surfaces and articles exemplified above.

EXAMPLE 27

Car Wash Application

A white car was chosen for the test. The car was last cleaned a few months prior to the test and was relatively heavily contaminated with dust, mud, oil and gasoline residues.

The first stage was rinsing the car with water.

In the second stage, one half of the car, lengthwise, was cleaned with a common household detergent, while the other half was cleaned with an aqueous solution containing 0.1% liposomes. In both cases, a clean cloth was used to wipe the contamination off the car. Each side was rinsed after washing in order not to allow drying of the cleaning agent. The wiping of each of the two sides was done with equal force, and an equal amount of time was spent per area.

The oil and gasoline residues were wiped with less time and effort using the lipsome solution, whereas in the case of the detergent, the whole contamination was not removable.

After rinsing the two sides, the following phemomena were observed: the side that was cleaned with the lipsomes repelled the water and left the surface almost dry; the other side had a thin film of water on it. Wiping the water residue from the liposome side was easy and fast, whereas the same on the other side required more time and effort. The liposome side was left with a wax-like effect and was bright and shiny; the other side was just clean.

EXAMPLE 28

Car Wash Application

The test of Example 27 was performed on another white car with the same cleaning method; however, this time the car was not rinsed after the washing, but left to dry.

The liposome side was left with very few "salty water marks" that were easily removed with a dry cloth. The other side was left with many such marks which were stuck to the surface and took a while to be removed.

EXAMPLE 29

Car Wash Application

A heavily-contaminated white car was again chosen for a test in a carwash tunnel. Once again, the idea was to check the visible difference between the use of liposomes and the detergent.

The standard procedure of this particular carwash, prior to the tunnel, starts with rinsing the car with water, washing it with a bucket of water and detergent using a cloth, and only after that, running the car through the tunnel.

Modifying the standard procedure, one-half of the car, lengthwise, was washed with the same 0.1% liposome aqueous solution as used in Example 27, using a clean cloth. The other side of the car was washed with a carwash detergent. The car was then sent to the tunnel.

The car came out of the tunnel with the liposome side almost completely dry and the other side required intensive drying effort. When using chamois to dry both sides of the car, the liposomes side, including the plastic and chrome-plated panels, were shiny and smooth. The other side was just clean.

EXAMPLE 30

Window and Windshield Cleaning 0.1% liposome aqueous solution was applied by means of a wet cloth to a front windshield of a car. Water was sprayed on the windshield. The surface was observed to repel the water, and the drops of water were seen to have "perled of" once hitting the windshield.

EXAMPLE 31

Window and Windshield Cleaning 0.1% liposome aqueous solution was applied by means of a wet cloth onto one-half of a front windshield on the driver's side.

The car was driven through a relatively heavy rain at 90 kph. Watching the road through the liposome portion of the windshield did not require the use of windshield wipers. The raindrops were observed to be repelled from the windshield, leaving tiny small drops.

The rest of the windshield was completely covered with a heavy film of water, which prevented the ability to see the road clearly enough to drive.

It will be evident to those skilled in the art that the invention is not limited to the details of the foregoing illustrative examples and that the present invention may be embodied in other specific forms without departing from the essential attributes thereof, and it is therefore desired that the present embodiments and examples be considered in all respects as illustrative and not restrictive, reference being made to the appended claims, rather than to the foregoing description, and all changes which come within the meaning and range of equivalency of the claims are therefore intended to be embraced therein.

What is claimed is:

1. A method for cleaning the surfaces of a motor vehicle which is contaminated with wastes containing organic or lipophilic deposits, comprising applying unilamellar liposomes thereto, which unilamellar liposomes modify the physical properties of said wastes to increase the polarity and wettability thereof.

2. A method according to claim 1, wherein said surfaces are coated metal surfaces.

3. A method according to claim 1, wherein said surfaces are painted metal surfaces.

4. A method according to claim 1, wherein said surfaces are glass surfaces.

5. A method according to claim 1, wherein said surfaces are plastic surfaces.

6. A method according to claim 1, wherein said wastes comprise oils, greases, gasoline residues, and carbonacious combustion products.

7. A method according to claim 1, wherein said liposomes have vesicles of a diameter of about 20–80 nm.

8. A method according to claim 1, wherein said liposomes are phospholipid liposomes.

* * * * *